(12) United States Patent
Chen

(10) Patent No.: US 11,341,871 B2
(45) Date of Patent: May 24, 2022

(54) STRETCHABLE FLEXIBLE DISPLAY PANEL AND DISPLAY DEVICE

(71) Applicant: Shanghai Tianma Micro-Electronics Co., Ltd., Shanghai (CN)

(72) Inventor: Haijing Chen, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 209 days.

(21) Appl. No.: 16/677,355

(22) Filed: Nov. 7, 2019

(65) Prior Publication Data

US 2020/0410906 A1    Dec. 31, 2020

(30) Foreign Application Priority Data

Jun. 27, 2019    (CN) .......................... 201910566240.0

(51) Int. Cl.
*G09F 9/30* (2006.01)
*H01L 27/32* (2006.01)
*H01L 51/56* (2006.01)

(52) U.S. Cl.
CPC ............ *G09F 9/301* (2013.01); *H01L 27/323* (2013.01); *H01L 27/3276* (2013.01); *H01L 51/56* (2013.01); *H01L 2251/5338* (2013.01)

(58) Field of Classification Search
CPC ... G09F 9/301; H01L 27/323; H01L 27/3276; H01L 51/56; H01L 2251/5338
See application file for complete search history.

(56) References Cited

U.S. PATENT DOCUMENTS

2019/0221632 A1*    7/2019    Tomitani .............. G09G 3/3258
2021/0167158 A1*    6/2021    Wang ................... H01L 51/0097

FOREIGN PATENT DOCUMENTS

| CN | 107039396 A | 8/2017 |
| CN | 207134068 U | 3/2018 |
| CN | 108933148 A | 12/2018 |

OTHER PUBLICATIONS

Machine Translation of CN108933148.*
First Chinese Office Action, dated Nov. 20, 2020, issued in Chinese Application No. 201910566240.0, filed Jun. 27, 2019, 9 pages.

* cited by examiner

*Primary Examiner* — Julia Slutsker
(74) *Attorney, Agent, or Firm* — Christensen O'Connor Johnson Kindness PLLC

(57) ABSTRACT

Embodiments of the present disclosure provide a stretchable flexible display panel and a display device. By providing a metal connecting structure having a buffering effect in a stretching region on the flexible display panel, it is possible to achieve electrical signal transmission among a plurality of first display sub-regions and achieve stretchability of the flexible display panel. Moreover, problems such as breakage of a metal trace inside the display panel caused by a stretching operation are less likely to occur, such that good stretchability is achieved.

25 Claims, 15 Drawing Sheets in an unstretched state in a stretched state in an unstretched state  in a first stretched state  in a second stretched state

STRETCHABLE FLEXIBLE DISPLAY PANEL AND DISPLAY DEVICE

CROSS-REFERENCE TO RELATED APPLICATIONS

The present application claims priority under 35 U.S.C. § 119 to Chinese Patent Application No. 201910566240.0, filed on Jun. 27, 2019, the content of which is incorporated herein by reference in its entirety.

TECHNICAL FIELD

The present disclosure relates to the field of display technologies, and more particularly, to a stretchable flexible display panel and a display device.

BACKGROUND

With the rapid development of the flat panel display technology, an Organic Light-Emitting Display (OLED) has been used more and more widely due to its excellent characteristics such as self-luminescence, high brightness, wide viewing angle, and fast response.

In the past two years, a concept of "bendable" and "foldable" products has been continuously promoted and popularized in designs of OLED display products. With an advent of flexible display screens, the design concept of display products has been further expanded, and a stretchable function of the flexible display screen has gradually become a relatively hot subdivision technology field of the flexible of ED display screen. For the flexible display screen, one important task in the current field of flexible display screen is how to meet requirements of stretchability while satisfying a normal display function.

SUMMARY

Embodiments of the present disclosure provide a stretchable flexible display panel and a display device.

In one aspect, an embodiment of the present disclosure provides a stretchable flexible display panel, including a display region, wherein the display region includes: a plurality of first display sub-regions located on a flexible substrate; a plurality of stretching regions located on the flexible substrate, any one of the plurality of stretching regions being located between two of the plurality of first display sub-regions; and a metal connecting structure provided in the plurality of stretching regions and configured to electrically connect any two adjacent ones of the plurality of first display sub-regions; wherein the metal connecting structure includes a first connecting trace, a second connecting trace, and a connecting end, and the connecting end includes an end of the first connecting trace and an end of the second connecting trace that are stacked and in direct contact with each other; the first connecting trace is located in a first metal layer and has a first curved structure; the second connecting trace is located in a second metal layer and has a second curved structure; and in a thickness direction of the display panel, the first connecting trace and the second connecting trace intersect with each other at a first region, and the connecting end is provided in a region other than the first region.

In a second aspect, an embodiment of the present disclosure provides a stretchable display device including a stretchable flexible display panel, the stretchable flexible display panel including a display region, wherein the display region includes: a plurality of first display sub-regions located on a flexible substrate; a plurality of stretching regions located on the flexible substrate, any one of the plurality of stretching regions being located between two of the plurality of first display sub-regions; and a metal connecting structure provided in the plurality of stretching regions and configured to electrically connect any two adjacent ones of the plurality of first display sub-regions; wherein the metal connecting structure includes a first connecting trace, a second connecting trace, and a connecting end, and the connecting end includes an end of the first connecting trace and an end of the second connecting trace that are stacked and in direct contact with each other; the first connecting trace is located in a first metal layer and has a first curved structure; the second connecting trace is located in a second metal layer and has a second curved structure; and; and in a thickness direction of the display panel, the first connecting trace and the second connecting trace intersect with each other at a first region, and the connecting end is provided in a region other than the first region.

BRIEF DESCRIPTION OF DRAWINGS

In order to more clearly illustrate technical solutions of embodiments of the present disclosure, the accompanying drawings used in the embodiments are briefly described below. The drawings described below are merely a part of the embodiments of the present disclosure. Based on these drawings, those skilled in the art can obtain other drawings without any creative effort.

FIG. 2 illustrates a partially enlarged schematic diagram of the display panel in FIG. 1 along a dotted box a;

FIG. 10 illustrates another partially enlarged schematic diagram of the display panel in FIG. 1 along a dashed box a;

FIG. 11 illustrates yet another partially enlarged schematic diagram of the display panel in FIG. 1 along a dashed box a;

DESCRIPTION OF EMBODIMENTS

Figure 1:
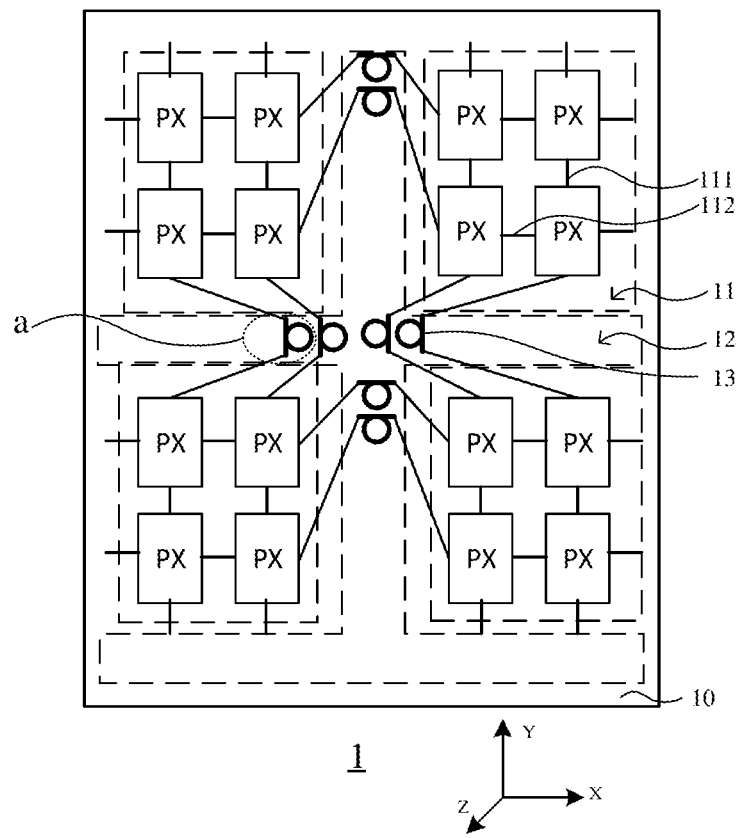
FIG. 1 illustrates a structural schematic diagram of a display panel provided by an embodiment of the present disclosure.

In order to better understand technical solutions of the present disclosure, the embodiments of the present disclosure are described in details with reference to the drawings. It should be clear that the described embodiments are merely part of the embodiments of the present disclosure rather than all of the embodiments.

The terms used in the embodiments of the present disclosure are merely for the purpose of describing particular embodiments and not intended to limit the present disclosure. Unless otherwise noted in the context, the singular form expressions "a", "an", "the" and "said" used in the embodiments and appended claims of the present disclosure are also intended to represent a plural form thereof.

It should be understood that the term "and/or" as used herein is merely an association describing the associated object, indicating that there may be three relationships. For example, A and/or B may indicate three cases: only A exists; both A and B exist; only B exists. In addition, a character "I" herein generally indicates that the contextual objects are in an "or" relationship.

In the description of the specification, it is to be understood that the terms "substantially", "about", "around", "basically", "generally", and the like, used in the claims and embodiments of the present disclosure indicate that it can be generally accepted within a reasonable process operation range or within a tolerance range, rather than an exact value.

It is to be understood that although the terms first, second, third, etc. may be used to describe connecting traces in the embodiments of the present disclosure, these connecting traces should not be limited to these terms. These terms are used to distinguish connecting traces from each other. For example, a first connecting trace may also be referred to as a second connecting trace, and similarly, the second connecting trace can also be referred to as the first connecting trace without departing from the scope of the embodiments of the present disclosure.

Most of the current stretchable display screens are provided with a plurality of display units on a display panel, and the display units are connected by metal traces. However, most metal trace connections still employ traditional wiring manners. Namely, electrical connection and signal transmission between two adjacent display units are achieved by a linear wiring manner. However, after being used by ordinary consumers, terminal electronic products of the stretchable display screen, such as a mobile phone, will be subjected to numerous times of stretching and bending operations, as well as accidents such as dropping. In view of this, inventors of the present disclosure conducted intensive research on how to achieve reliability of the metal traces on the display screen, and then disclosed the technical solution of the present disclosure. By providing a metal connecting structure having a buffering effect in a stretching region on the flexible display panel, it is possible to achieve both electrical signal transmission among a plurality of first display sub-regions and stretchability of the flexible display panel. Moreover, problems such as breakage of a metal trace inside the display panel caused by a stretching operation are less likely to occur, such that good stretchability is achieved.

As shown in FIG. 1 to FIG. 25, the present disclosure provides a flexible display panel 1. A display region is formed on a flexible substrate 10. A plurality of first display sub-regions 11 is provided in the display region, and a plurality of stretching regions 12 are provided between any two of the first display sub-regions 11. The stretching regions 12 are provided along an X direction and a Y direction in the display region, thereby defining the plurality of first display sub-regions 11 through crisscrossing. Further, by providing the stretching regions 12 in two dimensional directions, a stretching ability of the display panel 1 can be achieved.

For the display region, the first display sub-region 11 includes a plurality of pixel units PX arranged in an array, and signal transmission wires connecting the plurality of pixel units (such as a first signal transmission wire 111 arranged to extend in the Y direction and a second signal transmission wire 112 arranged to extend in the X direction, as shown in FIG. 1). Each pixel unit PX correspondingly includes a pixel driving circuit (e.g., including a driving transistor T) and a light-emitting unit OL. The plurality of pixel units PX in the display region is electrically connected to each other through the signal transmission wires. For example, a plurality of pixel units PX located in the same row are supplied with a gate driving signal by the same scanning signal wire.

In order to achieve the stretching performance of the display panel 1 and not to affect the display effect of the display panel, in one embodiment of the present disclosure, no pixel unit PX is provided in the stretching regions 12. If the pixel unit PX is provided in the stretching regions 12, the light-emitting unit OL will suffer a relatively serious loss during a stretching operation, because the stretching regions are main stress-bearing points.

However, in order to achieve signal transmission between the pixel units PX in the plurality of first display sub-regions 11, in one embodiment of the present disclosure, a plurality of metal connecting structures 13 are provided in the stretching regions 12, such that electrical connection and signal transmission between any two adjacent first display sub-regions 11 are achieved. For example, the display region of the display panel 1 includes: a first signal transmission wire 111 and an light-emitting control signal wire which are arranged to extend in the Y direction; a second signal transmission wire 112 and a constant high potential signal wire which are arranged to extend in the X direction; and a touch lead provided in a touch unit on a light exiting side of the display region, or the like.

Figure 2:
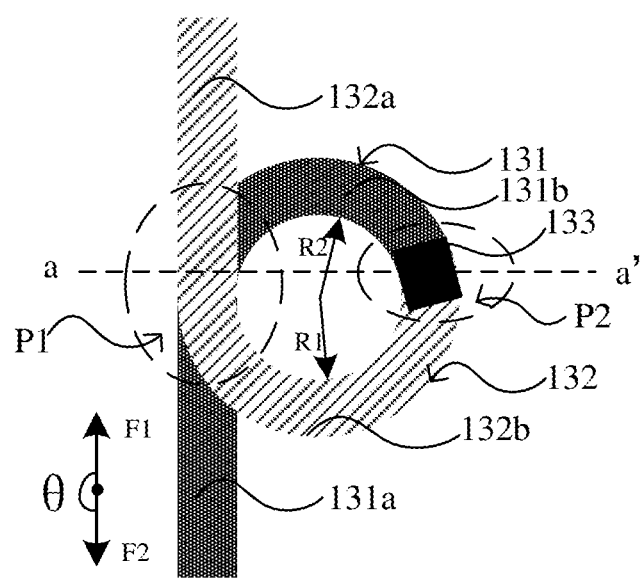
Figure 6:
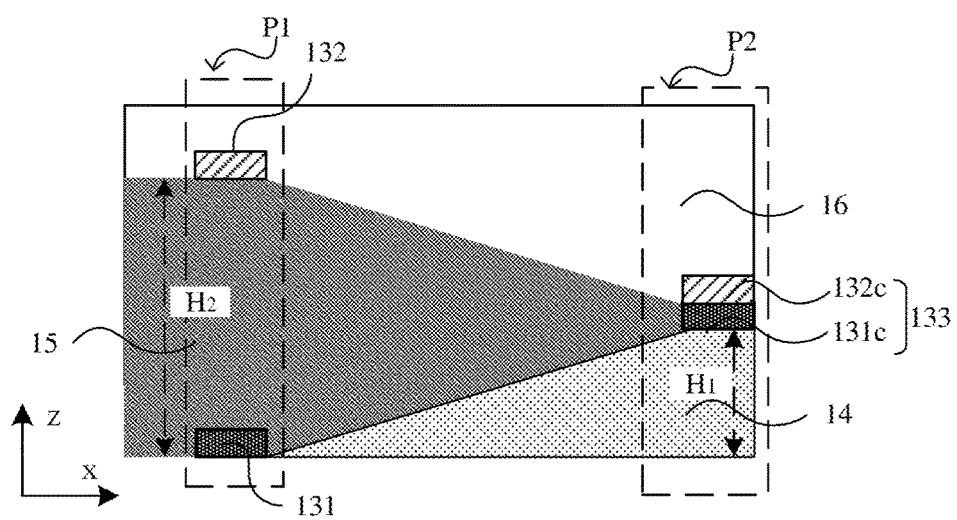
FIG. 6 illustrates a cross-sectional schematic diagram of a metal connecting structure 13 in FIG. 2 taken along a dotted line aa'.

In order to achieve the anti-stretching ability of the stretching regions 12, in one embodiment of the present disclosure, the metal connecting structure 13 is formed by two metal layers. As shown in FIGS. 1, 2 and 6, the metal connecting structure 13 includes a first connecting trace 131, a second connecting trace 132, and a connecting end 133. The connecting end 133 is arranged by directly contacting and stacking an end 131c of the first connecting trace and an end 132c of the second connecting trace. As shown in FIG. 6, in the second region P2, the end 132c of the second connecting trace is directly laminated on the end 131c of the first connecting trace. Since the connecting end 133 is arranged as a double-layered metal layer, stress tolerance of the metal connecting structure 13 can be enhanced.

Starting from the connecting end 133, the first connecting trace 131 and the second connecting trace 132 are first arranged into a coiled configuration, intersect with each other at a first region P1, and then extend linearly respectively. For example, as shown in FIG. 2 and FIG. 6, the first connecting trace 131 includes the end 131c of the first connecting trace, a first curved structure 131b and a first straight portion 131a, and these three are formed by patterning a first metal layer. The first curved structure 131b has a curvature radius R1. The second connecting trace 132 includes the end 132c of the second connecting trace, a second curved structure 132b and a second straight portion 132a, and these three are formed by patterning a second metal layer. The second curved structure 132b has a curvature radius R2.

With reference to FIG. 2 and FIG. 6, in a thickness direction Z of the display panel, the first connecting trace 131 and the second connecting trace 132 intersect with each other at the first region P1, and the connecting end 133 is provided in a region other than the first region P1, i.e., a second region P2 enclosed by a dotted box in FIG. 2. Namely, starting from the second region where the connecting end 133 is located, the first connecting trace 131 and the second connecting trace 132 are first arranged in a curved shape, intersect with each other at the first region P1, and then respectively extend in a first direction F1 and a second direction F2 with the display panel being in an unstretched state. Moreover, an angle between the first direction F1 and the second direction F2 is greater than or equal to 90°. In an embodiment of the present disclosure, in the thickness direction Z of the display panel, orthographic projections of the first curved structure 131b and the second curved structure 132b form a ring-shaped structure. The metal connecting structure 13 has a ring-shaped structure starting from the connecting end 133, so when it is stretched by an external force, the connecting end 133 first serves as a main force bearing point. Further, generated stresses will be respectively distributed to the corresponding ring-shaped curved structures on the first connecting trace 131 and the second connecting trace 132, and since it is made of a metal material, a buffering effect on the stress is achieved, thereby preventing the metal structure from suffering problems such as being broken or damaged due to stress concentration and the like.

In order to further optimize the anti-stretching ability of the metal connecting structure 13, with continued reference to FIGS. 2 and 6, in an embodiment of the present disclosure, the metal connecting structure 13 may be arranged as a spiral structure. For example, as shown in FIG. 6, in the thickness direction Z of the display panel, starting from the connecting end 133, the first connecting trace 131 spirals downward, and is bent first and then extends linearly; starting from the connecting end 133, the second connecting trace 132 spirals upward, and is bent first and then extends linearly. Therefore, a spiral structure starting from the connecting end 133 is formed. In addition, an organic buffer layer is provided between the first connecting trace 131 and the second connecting trace 132, so when an external force stretches the display panel, stress in the stretching region 12 is sufficiently released by the spiral structure.

Figure 3:
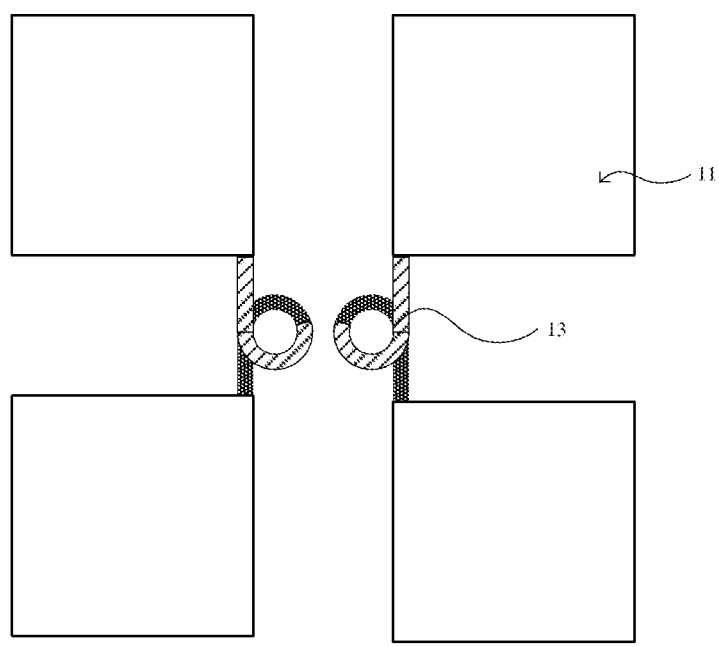
FIG. 3 illustrates a partially enlarged schematic diagram of the display panel 1 in FIG. 1 in an unstretched state.
Figure 4:
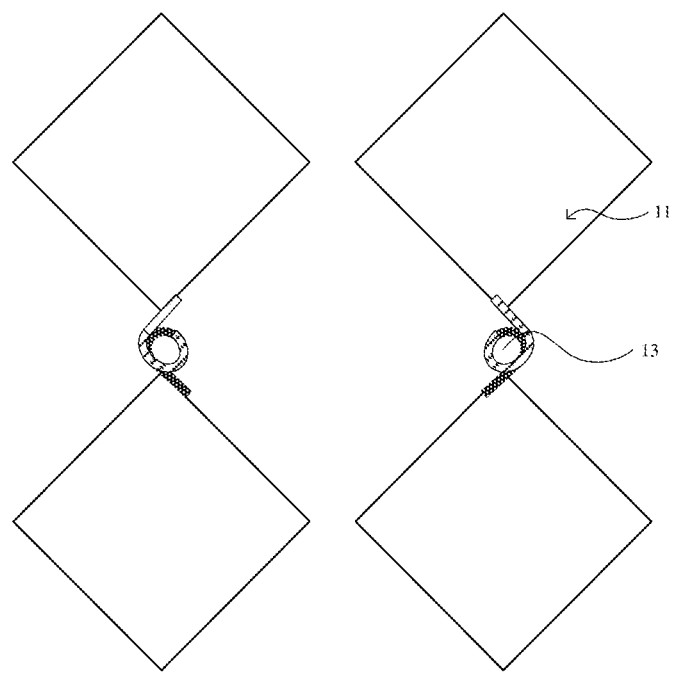
FIG. 4 illustrates a partially enlarged schematic diagram of the display panel 1 in FIG. 1 in a stretched state.
Figure 5:
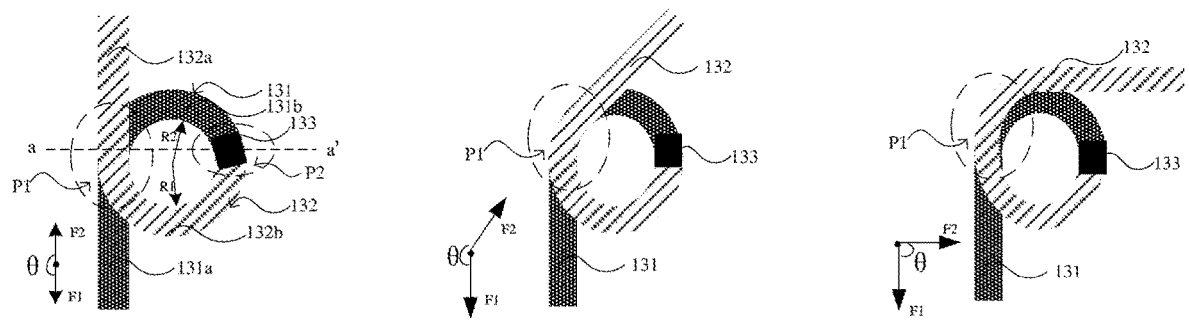
FIG. 5 illustrates a schematic diagram of a metal connecting structure 13 in FIG. 1 in an unstretched state and in a stretched state.

For example, as shown in FIGS. 3 to 5, when the display panel 1 is in a normal state, i.e., an unstretched state, the metal connecting structure 13 located in the stretching region 12 is in a flattened state, as the metal connecting structure 13 in the unstretched state in FIGS. 3 and 5. Namely, the first straight portion 131a of the first connecting trace 131 extends in the first direction F1, and the curvature radius R1 of the first curved structure 131b is in a preset state; the second straight portion 132a of the second connecting trace 132 extends in the second direction F2, and the curvature radius R2 of the second curved structure 132b is in a preset state. The angle θ between the first direction F1 and the second direction F2 is about 180°. Namely, the first direction F1 and the second direction F2 respectively extend in opposite directions.

When the display panel is stretched by an external three and thus the display panel is in a stretched state, the metal connecting structure 13 located in the stretching region 12 is in a stretched state, as the metal connecting structure 13 in the stretched state as shown in FIGS. 4 and 5. Further, when being stretched by the external force, the metal connecting structure 13 having a ring-shaped structure or a spiral structure will generate a corresponding deformation because of the stress. It can be similarly understood that when a spring is stretched by an external force, a change in length or a change in curvature radius is generated under the effect of the stress. A similar deformation will occur when the metal connecting structure 13 in the present disclosure is subjected to an external force. For example, as shown in FIG. 3 and FIG. 5, when subjected to an external force, the generated stress, from the connecting end 133, is dispersed to the corresponding ring-shaped curved structures on the first connecting trace 131 and the second connecting trace 132 respectively, so that the curvature radiuses of the curved structures are changed. When the external stretching force is relatively small, as shown in FIG. 5, in the case where the metal connecting structure 13 is in the stretched state 1, the angle θ between the first direction F1 and the second direction F2 changes, for example, into an obtuse angle; when the external stretching force is relatively large, as shown in FIG. 5, in the case where the metal connecting structure 13 is in the stretched state 2, the angle θ between the first direction F1 and the second direction F2 changes, for example, into a right angle. In the embodiment of the present disclosure, when the display panel 1 is subjected to an external stretching force, the metal connecting structure 13 becomes a main force bearing point. The curvature radius R1 of the first curved structure 131b and/or the curvature radius R2 of the second curved structure 132b are changed, so that the buffering effect on the external force can be achieved, thereby preventing the external stretching force from damaging the stretching region 12 and the metal trace in the first display sub-region 11. Moreover, since the metal connecting structure 13 itself also plays a role of signal transmission, it is also possible to prevent the metal connecting structure 13 from being broken.

Figure 7:
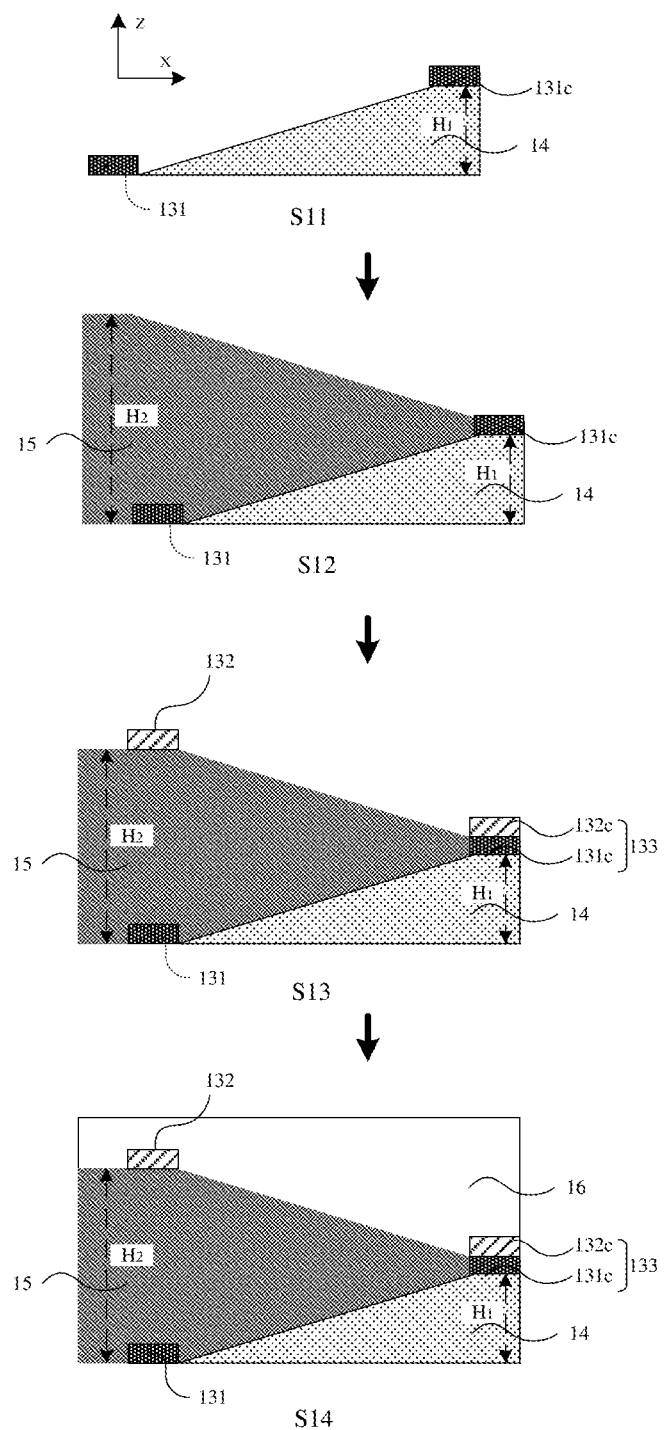
FIG. 7 illustrates a schematic flow diagram showing preparation of the metal connecting structure 13 in FIG. 6.

Based on the above embodiments, in an embodiment of the present disclosure, the specific structure of the metal connecting structure 13 is implemented that the connecting end 133 is arranged in a middle portion, as shown in FIGS. 6 to 7, the first connecting trace 131, the second connecting trace 132, and the connecting end 133 are provided in different layers from each other, and in the thickness direction Z of the display panel, the connecting end 133 is provided between the first connecting trace 131 and the second connecting trace 132.

A first organic buffer layer 15 is provided between the first connecting trace 131 and the second connecting trace 132 and covers the first connecting trace 131; a second organic buffer layer 14 is provided between the first connecting trace 131 and the connecting end 133. Both the first organic buffer layer 15 and the second organic buffer layer 14 can be formed to have a slope structure by etching with a half tone mask, as shown in FIG. 6. In the present embodiment, the connecting end 133 is provided on the second organic buffer layer 14 and located between the first connecting trace 131 and the second connecting trace 132 as required. In the thickness direction Z of the display panel, a maximum thickness H2 of the first organic buffer layer 15 (a maximum distance from the bottom to the top of the first organic buffer layer 15 in the Z direction) can be arranged to be greater than a maximum thickness H1 of the second organic buffer layer 14 (a maximum distance from the bottom to the top of the second organic buffer layer 14 in the Z direction).

In addition, in order to further guarantee the anti-stretching ability and corresponding mechanical strength of the metal connecting structure 13, in an embodiment of the present disclosure, Young's modulus of the first organic buffer layer 15 and the second organic buffer layer 14 is smaller than 10 GPa. The first organic buffer layer 15 has a first Young's modulus E1; the second organic buffer layer 14 has a second Young's modulus E2; the first Young's modulus E1 is smaller than 10 GPa; and the second Young's modulus E2 is smaller than 10 GPa. In an embodiment, the Young's modulus of the first organic buffer layer 15 and the second organic buffer layer 14 need to be smaller than 1 GPa. Namely, flexibility of the first organic buffer layer 15 and the second organic buffer layer 14 is greater than that of the flexible substrate 10, so that it can be achieved that the stretching region 12 has good flexibility, and thus can be deformed preferentially during the stretching operation to bear the stretching force, thereby preventing the first display sub-region 11 from being damaged by the stretching force.

In addition, in order to further protect the metal connecting structure 13, in an embodiment of the present disclosure, a first organic planarization layer 16 is provided in the stretching region 12. The first organic planarization layer 16 covers the second connecting trace 132 and the connecting end 133, so that the metal connecting structure 13 can be protected from scratches which will result in a risk of breakage. Further, in this embodiment, the first organic planarization layer 16 has a fifth Young's modulus E5 smaller than 10 GPa. In an embodiment, the Young's modulus of the first organic planarization layer 16 is smaller than 1 GPa, to further guarantee the flexibility of the stretching region. In order to further simplify a preparation process of the metal connecting structure 13, in an embodiment of the present disclosure, the first organic buffer layer 15, the second organic buffer layer 14 and the first organic planarization layer 16 may be made of buffer materials, for example containing the same polymer resin material. For example, in an embodiment, all of the three are made of an organic polymer resin whose Young's modulus is smaller than 1 GPa, such as polyimide (PI) or polypropylene. Therefore, in the preparation process, types of the materials of the buffer layers are reduced, and thus cost of the consumable material is reduced.

As shown in FIG. 7, a preparation process of the metal connecting structure 13 includes:

step S11: forming the second organic buffer layer 14 having a slope structure by etching with a half tone mask, and respectively forming the first connecting trace 131 and the first connecting trace end 131c by metal deposition on the second organic buffer layer 14;

step S12: forming the first organic buffer layer 15 having a slope structure by half mask etching, the first organic buffer layer 15 covering the first connecting trace 131 and the first connecting trace end 131c;

step S13: forming the second connecting trace 132 and the second connecting trace end 132c by metal deposition on the first organic buffer layer 15; and step S14: forming the first organic planarization layer 16 by coating, to cover the second connecting trace 132 and the second connecting trace end 132c.

Figure 8:
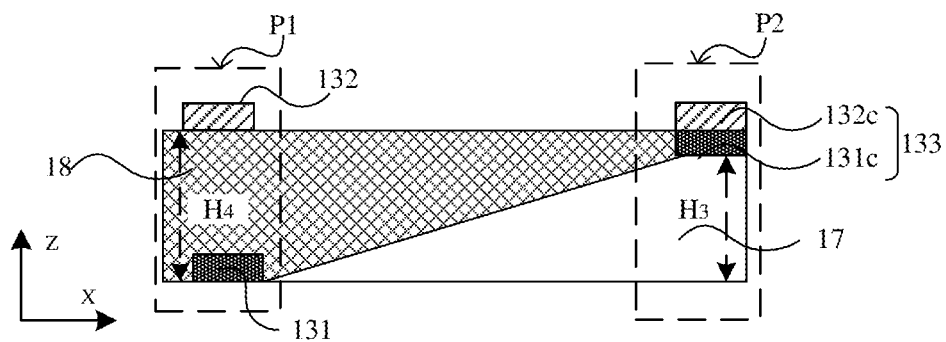
FIG. 8 illustrates another cross-sectional schematic diagram of the metal connecting structure 13 in FIG. 2 taken along a dotted line aa'.
Figure 9:
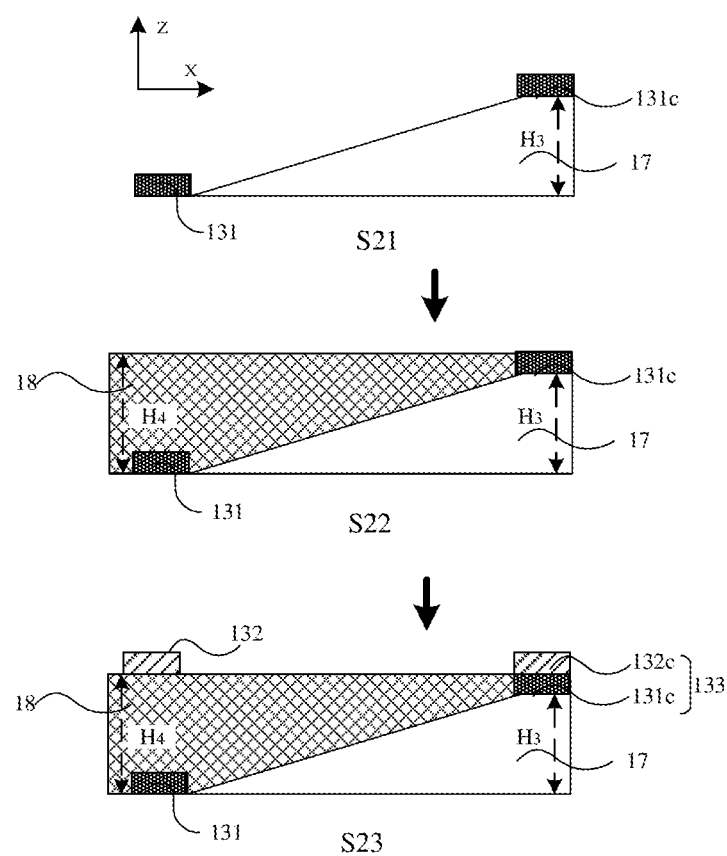
FIG. 9 illustrates a schematic flow diagram showing preparation of the metal connecting structure 13 in FIG. 8.

On the basis of the above embodiments, in an embodiment of the present disclosure, the specific structure of the metal connecting structure 13 is implemented that in the thickness direction of the display panel, the connecting end 133 is provided in the middle portion, i.e., between the first connecting trace 131 and the second connecting trace 132. In another embodiment, as shown in FIG. 8 to FIG. 9, the second connecting trace 132 and the connecting end 133 are provided in the same layer, and in the thickness direction Z of the display panel, the first connecting trace 131 and the second connecting trace 132 are provided in different layers. For example, a third organic buffer layer 18 is provided between the first connecting trace 131 and the second connecting trace 132 and covers the first connecting trace 131; a fourth organic buffer layer 17 is provided between the first connecting trace 131 and the connecting end 133. The fourth organic buffer layer 17 can be formed to have a slope structure by half mask etching, as shown in FIG. 8.

In an embodiment, the connecting end 133 is provided in the fourth organic buffer layer 17, and is provided in the same layer as the second connecting trace 132. In the thickness direction Z of the display panel, a maximum thickness H4 of the third organic buffer layer 18 (a maximum distance from the bottom to the top of the third organic buffer layer 18 in the Z direction) can be arranged to be substantially equal to a maximum thickness H3 of the fourth organic buffer layer 17 (a maximum distance from the bottom to the top of the fourth organic buffer layer 17 in the Z direction).

In addition, in order to further guarantee the tensile performance and corresponding mechanical strength of the metal connecting structure 13, in an embodiment of the present disclosure, Young's modulus of the third organic buffer layer 18 and the fourth organic buffer layer 17 is smaller than 10 GPa. The third organic buffer layer 18 has a third Young's modulus E3; the fourth organic buffer layer 17 has a fourth Young's modulus E4; the third Young's modulus E3 is smaller than 10 GPa; and the fourth Young's modulus E4 is smaller than 10 GPa. In an embodiment, the Young's modulus of the third organic buffer layer 18 and the fourth organic buffer layer 17 is smaller than 1 GPa. Namely, flexibility of the third organic buffer layer 18 and the fourth organic buffer layer 17 is greater than that of the flexible substrate 10, so that it can be achieved that the stretching region 12 has good flexibility, and thus can be deformed preferentially during the stretching operation to bear the stretching force, thereby preventing the first display sub-region 11 from being damaged by the stretching force.

A preparation process of the metal connecting structure 13, as shown in FIG. 9, includes:

step S21: forming the fourth organic buffer layer 17 having a slope structure by half mask etching, and respectively forming the first connecting trace 131 and the first connecting trace end 131c on the fourth organic buffer layer 17 by metal deposition;

step S22: forming the third organic buffer layer 18 by coating, to cover the first connecting trace 131 and the first connecting trace end 131c; and step S23: forming the second connecting trace 132 and the second connecting trace end 132c on the third organic buffer layer 18 by metal deposition.

The above preparation method for the metal connecting structure 13 achieves reduced process cost. In addition, the metal connecting structure 13 may be protected by coating an organic planarization layer on the outside of the second connecting trace 132 and the second connecting trace end 132c.

In summary, good stretching performance of the stretching region 12 can be achieved through the metal connecting structure 13 having the ring-shaped buffer structure formed by different methods.

In addition, in the technical solutions disclosed in the present disclosure, the metal connecting structure 13 not only needs to achieve good ductility of the stretching region 12, but also needs to achieve a function of transmission of driving signals among a plurality of mutually independent first display sub-regions 11. In an embodiment, as shown in FIG. 1 and FIGS. 10 to 12, the display panel 1 includes signal transmission wires (e.g., in FIG. 1, a first signal transmission wire 111 arranged to extend in the Y direction and a second signal transmission wire 112 arranged to extend in the X direction) for providing a driving signal to the plurality of first display sub-regions 11; the signal transmission wire is electrically connected to the metal connecting structure 13 to achieve that the driving signal is transmitted to the plurality of first display sub-regions 11.

Figure 10:
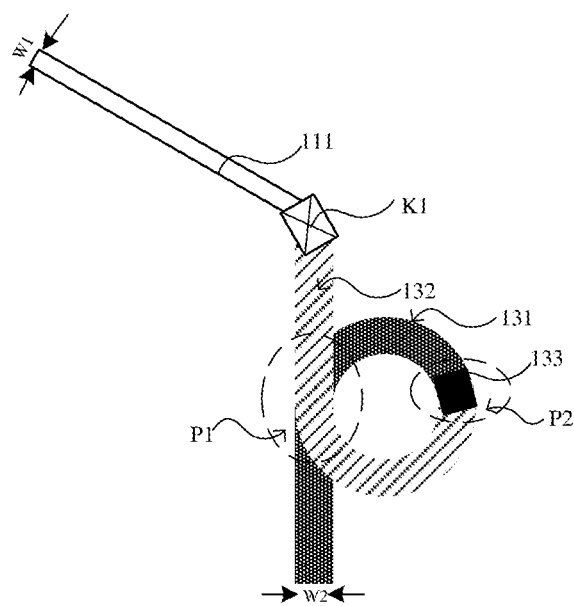

In another embodiment of the present disclosure, as shown in FIG. 10, the first signal transmission wire 111 located in the first display sub-region 11 has a first wire width W1; the metal connecting structure 13 located in the stretching region 12 has a second wire width W2, and the second wire width W2 is greater than the first wire width W1. Namely, in order to equalize the difference in resistance between the first signal transmission wire 111 and the metal connecting structure, in this embodiment, the width of the metal connecting structure 13 is arranged to be greater than that of the first signal transmission wire 111, so that it is guaranteed that unit resistances of them are the same. Thus, problems, such as an excessive load which will affect the display quality of a display screen, are avoided. In addition, in this embodiment, the first signal transmission wire 11 and the second connecting trace 132 in the metal connecting structure 13 are connected, e.g., the electrical connection between the two is achieved through a first via hole K1.

Figure 11:
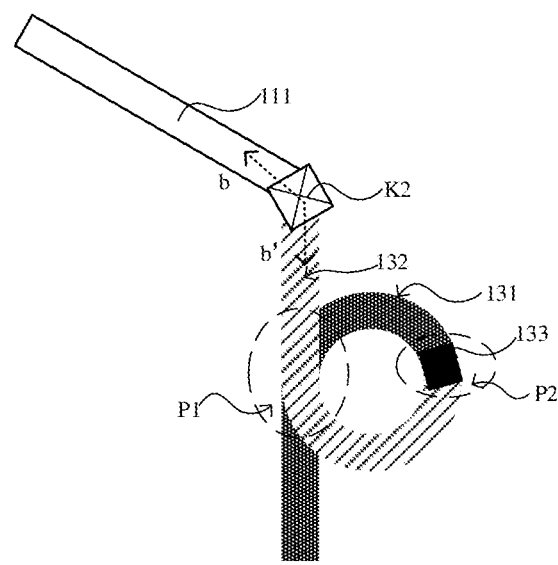
Figure 12:
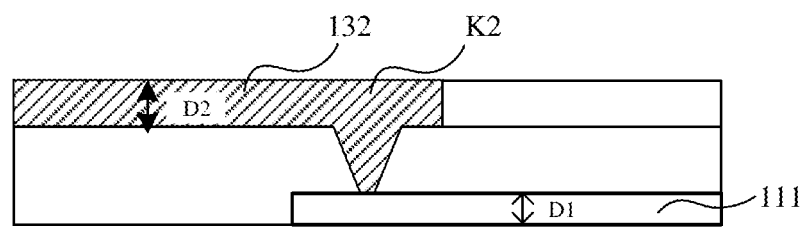
FIG. 12 illustrates a cross-sectional schematic diagram taken along a dotted line bb' in FIG. 11.

In order to optimize transmission performance of the signal transmission wire, in another embodiment disclosed in the present disclosure, as shown in FIGS. 11 to 12, the first signal transmission wire 111 located in the first display sub-region 11 has a first thickness D1; the metal connecting structure 13 located in the stretching region 12 has a second thickness D2, and the second thickness D2 is greater than the first thickness D1. Namely, in order to equalize the difference in resistance between the first signal transmission wire 111 and the metal connecting structure, in this embodiment, the thickness of the metal connecting structure 13 is arranged to be greater than that of the first signal transmission wire 111, so that it is achieved that the unit resistances of them are the same. Thus, no excessive load will be generated to affect the display quality of a display screen. In addition, in this embodiment, the first signal transmission wire 111 and the second connecting trace 132 in the metal connecting structure 13 are connected, e.g., the electrical connection between the two is achieved through a second via hole K2.

In order to further optimize a metal wiring manner on the display panel and reduce the number of the metal layers, so as to reduce the process design difficulty and process yield of the display panel, sufficient research and consideration have been made on the specific arrangement manner of the metal connecting structure 13. By multiplexing the metal layer of the metal signal wire in the display region, it is not necessary to separately provide two metal layers for the metal connecting structure 13.

Figure 13:
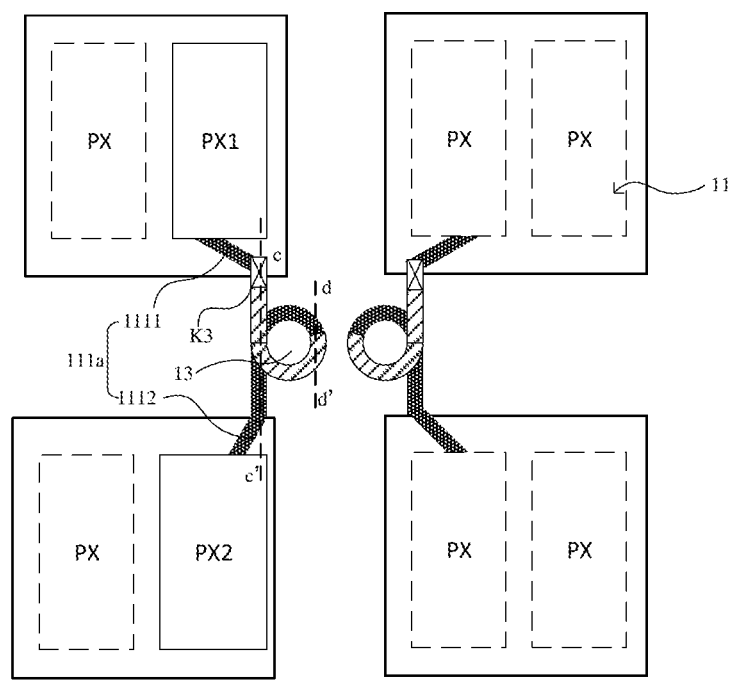
FIG. 13 illustrates another structural schematic diagram of a display panel provided by an embodiment of the present disclosure.
Figure 14:
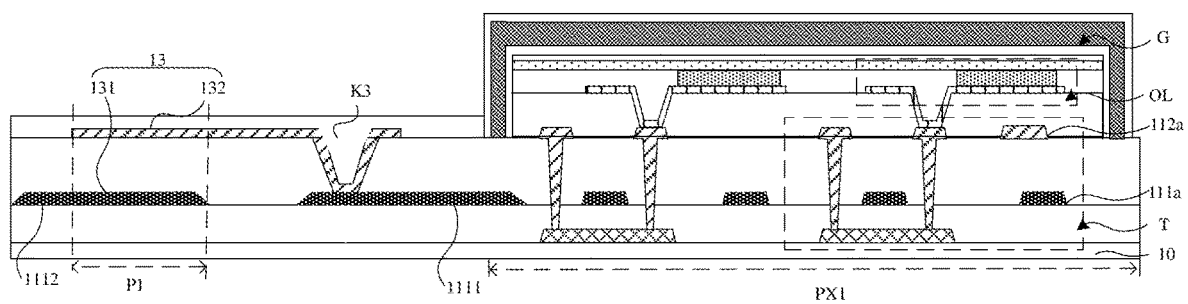
FIG. 14 illustrates a cross-sectional schematic diagram taken along a dotted line cc' in FIG. 13.
Figure 15:
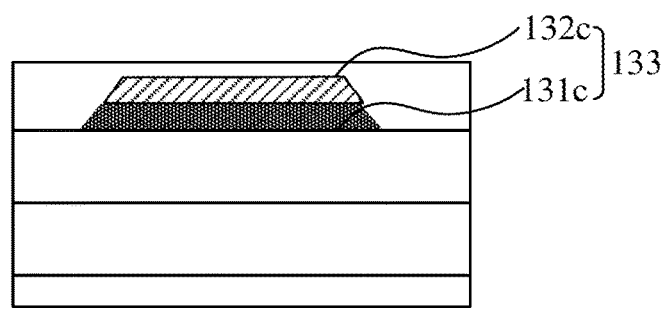
FIG. 15 illustrates a cross-sectional schematic diagram taken along a dotted line dd' in FIG. 13.

Based on the embodiments disclosed above, as shown in FIG. 1 and FIGS. 13 to 15, the signal transmission wire in the display region includes a scanning signal wire 111a and a data signal wire 112a. A gate driving signal SCAN is provided to a plurality of pixel units PX through the scanning signal wire 111a; and a data driving signal DATA is provided to the plurality of pixel units PX through the data signal wire 112a. Moreover, the first metal layer is further patterned to form the scanning signal wire 111a, and the first connecting trace 131 is provided in the same layer as the scanning signal wire 111a; the second metal layer is further patterned to form the data signal wire 112a, and the second connecting trace 132 is provided in the same layer as the data signal wire 112a. In adjacent two of the first display sub-regions 11, the electrical connection of the scanning signal wire 111a is achieved by the metal connecting structure 13. Taking FIG. 13 as an example, for a first pixel unit PX1 and a second pixel unit PX2 in adjacent two of the first display sub-regions 11, the scanning signal wire 111a includes a first scanning signal wire 1111 electrically connected to the first pixel unit PX1 and a second scanning signal wire 1112 electrically connected to the second pixel unit PX2, and the two are electrically connected through the metal connecting structure 13. As shown in FIGS. 14-15, the first scanning signal wire 1111 is electrically connected to the second connecting trace 132 through the third via hole K3; the end 131c of the first connecting trace and the end 132c of the second connecting trace are stacked and in direct contact with each other at the connecting end 133; and the second scanning signal wire 1112 is directly connected to the first connecting trace 131.

As shown in FIG. 13 to FIG. 14, for the pixel unit PX, taking the first pixel unit PX1 as an example, it includes a corresponding pixel driving circuit, such as a driving transistor T; and a corresponding light-emitting unit OL. Further, the first display sub-region 11 includes a separate flexible encapsulation layer G, while the stretching region 12 is provided with no flexible encapsulation layer G. In the following embodiments, the same is true for the pixel unit PX and the first display sub-region 11, and details are not described herein again.

In the present embodiment, the scanning signal wire 111a, the data signal wire 112a and the metal connecting structure 13 are formed by multiplexing the first metal layer and the second metal layer, so that the number of the metal film layers in the display panel can be reduced, and thus the process design difficulty and process yield of the display panel can be reduced.

Based on the embodiments disclosed above, the present disclosure further discloses another embodiment. As shown in FIGS. 1 and 16 to 18, the signal transmission wire in the display region includes a scanning signal wire 111a, a data signal wire 112a and a constant potential signal wire 111e. A gate driving signal SCAN is provided to the plurality of pixel units PX through the scanning signal wire 111a; a data driving signal DATA is provided to the plurality of pixel units PX through the data signal wire 112a; and a constant potential is provided to the display panel through the constant potential signal wire 111e, e.g., a reference signal wire that provides a constant low potential or a PVDD signal wire that provides a constant high potential.

The first metal layer is patterned to form the data signal wire 112a, and the first connecting trace 131 is provided in the same layer as the data signal wire 112a; the second metal layer is patterned to form the constant potential signal wire 111e, and the second connecting trace 132 is provided in the same layer as the constant potential signal wire 111e; the third metal layer is patterned to form the scanning signal wire 111a; and in adjacent two of the first display sub-regions 11, the electrically connection of the data signal wire 112a is achieved by the metal connecting structure 13.

Figure 16:
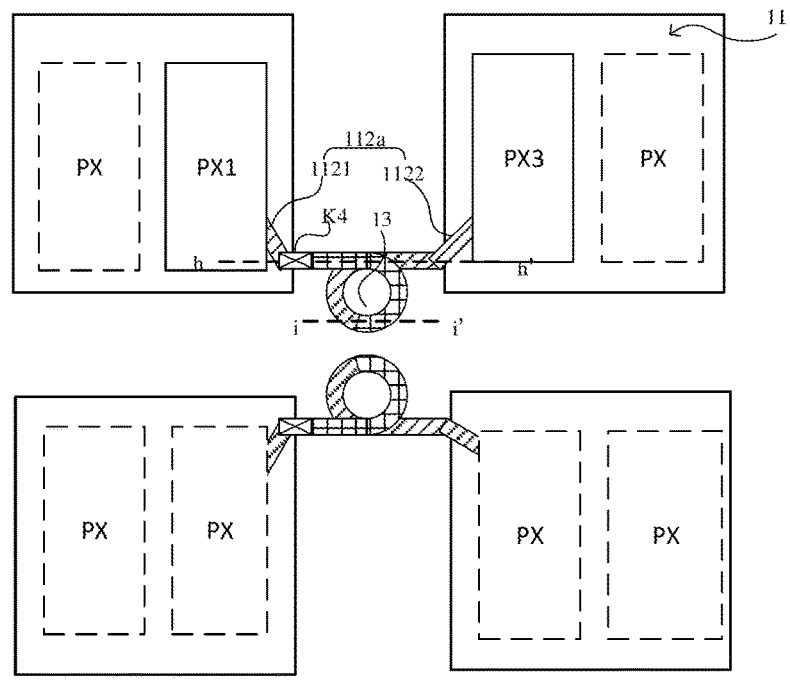
FIG. 16 illustrates another structural schematic diagram of a display panel provided by an embodiment of the present disclosure.
Figure 17:
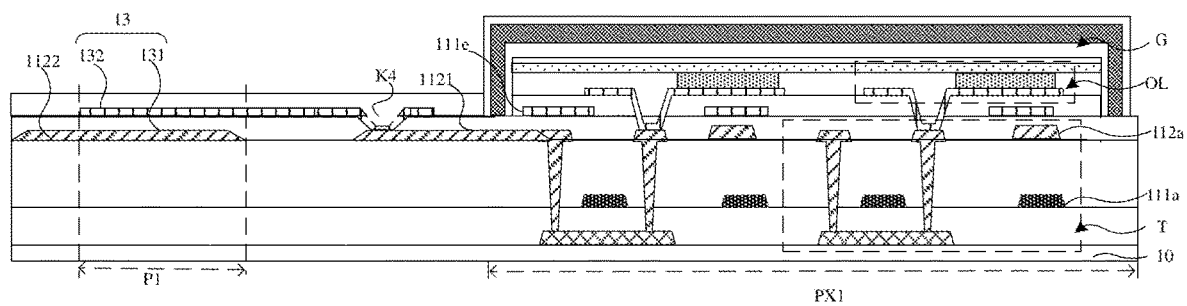
FIG. 17 illustrates a cross-sectional schematic diagram taken along a dotted line ee' in FIG. 16.
Figure 18:
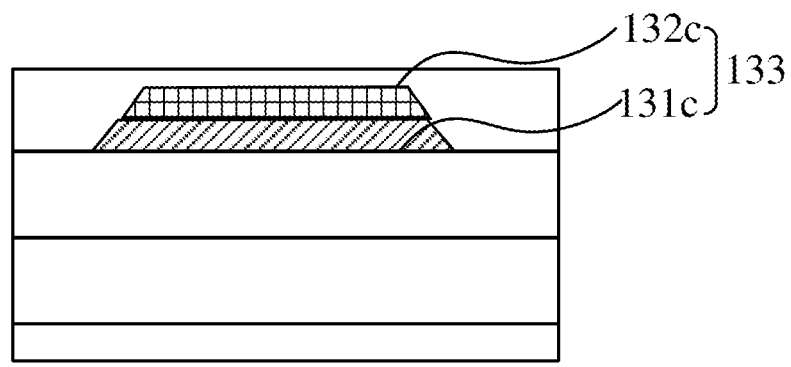
FIG. 18 illustrates a cross-sectional schematic diagram taken along a dotted line ff' in FIG. 16.

For example, as shown in FIG. 16, in adjacent two of the first display sub-regions 11, the electrically connection of the data signal wire 112a is achieved by the metal connecting structure 13. Taking FIG. 16 as an example, for the first pixel unit PX1 and the third pixel unit PX3 in adjacent two first display sub-regions 11, the data signal wire 112a includes a first data signal wire 1121 located in the first pixel unit PX1 and a second data signal wire 1122 located in the third pixel unit PX3, and the two are electrically connected by the metal connecting structure 13. As shown in FIGS. 16-17, the first data signal wire 1121 is electrically connected to the second connecting trace 132 through a fourth via hole K4; the end 131c of the first connecting trace and the end 132c of the second connecting trace are stacked and in direct contact with each other at the connecting end 133; and the second data signal wire 1122 is directly connected to the first connecting trace 131.

In the present embodiment, the data signal wire 112a, the constant potential signal wire 111e and the metal connecting structure 13 are formed by multiplexing the first metal layer and the second metal layer, so that the number of the metal film layers in the display panel can be reduced, and thus the process design difficulty of the display panel is reduced and the process yield thereof is increased.

Based on the embodiments disclosed above, the present disclosure also discloses another embodiment. As shown in FIGS. 1 and 19 to 21, the signal transmission wires in the display region include a scanning signal wire 111a, a data signal wire 112a and a second constant potential signal wire 111c. The scanning signal wire 111a is used to provide a gate driving signal SCAN to the plurality of pixel units PX; the data signal wire 112a is used to provide a data driving signal DATA to the plurality of pixel units PX; the second constant potential signal wire 111e is used to provide a constant potential to the display panel, e.g., a reference signal wire for providing a constant low potential or a PVDD signal wire for providing a constant high potential.

The first metal layer is patterned to form the scanning signal wire 111a, and the first connecting trace 131 is provided in the same layer as the scanning signal wire 111a. The second metal layer is patterned to form the second constant potential signal wire 111c, and the second connecting trace 132 is provided in the same layer as the second constant potential signal wire 111e; and the third metal layer is patterned to form the data signal wire 112a. In adjacent two first display sub-regions 11, the electrical connection of the second constant potential signal wire 111c is achieved through the metal connecting structure 13.

Figure 19:
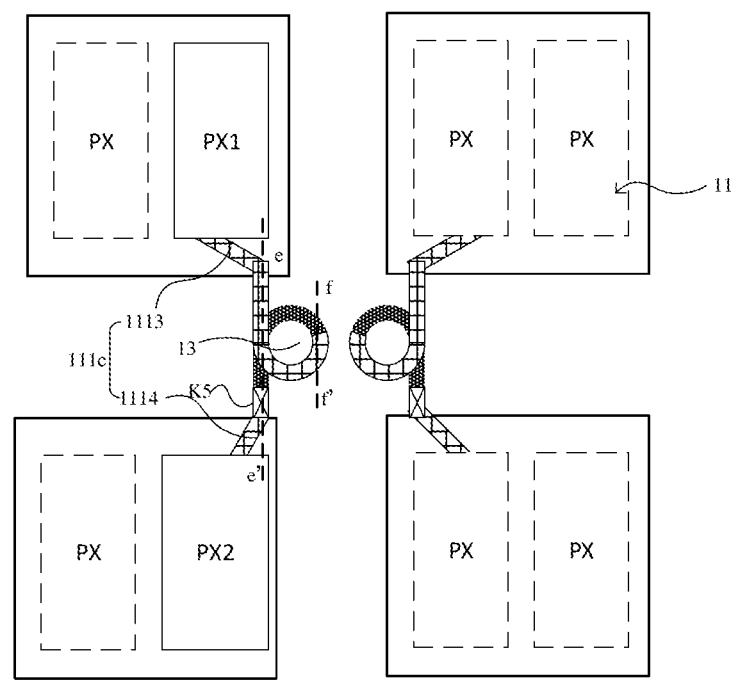
FIG. 19 illustrates another structural schematic diagram of a display panel provided by an embodiment of the present disclosure.
Figure 20:
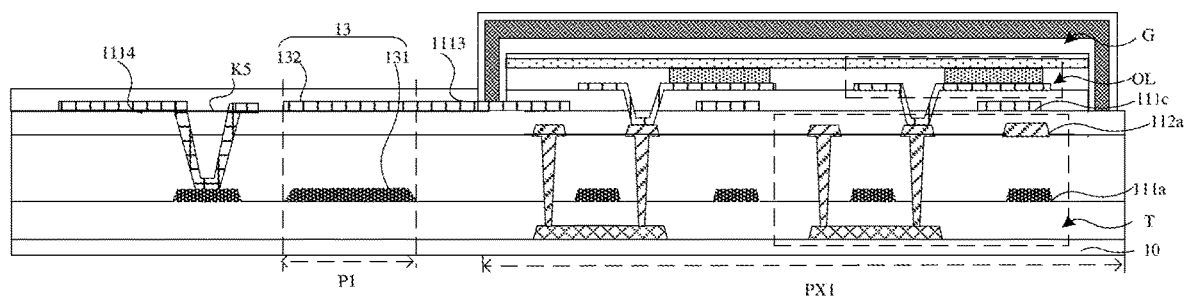
FIG. 20 illustrates a cross-sectional schematic diagram taken along a dotted line hh' in FIG. 19.
Figure 21:
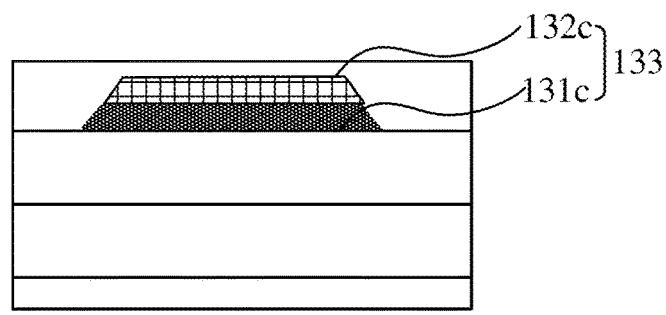
FIG. 21 illustrates a cross-sectional schematic diagram taken along a dotted line ii' in FIG. 19.
Figure 22:
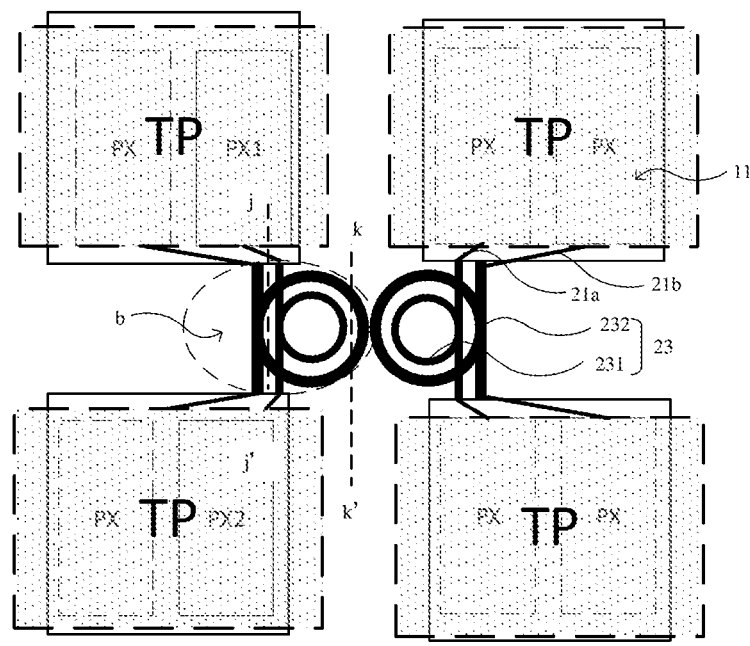
FIG. 22 illustrates another structural schematic diagram of a display panel provided by an embodiment of the present disclosure.
Figure 23:
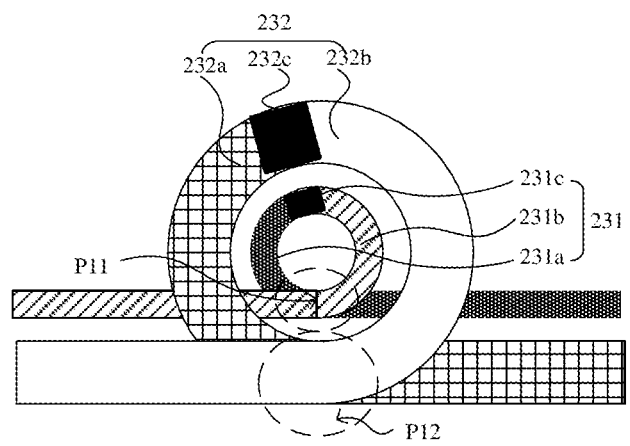
FIG. 23 illustrates a partially enlarged schematic diagram along a dotted box b in FIG. 22.
Figure 24:
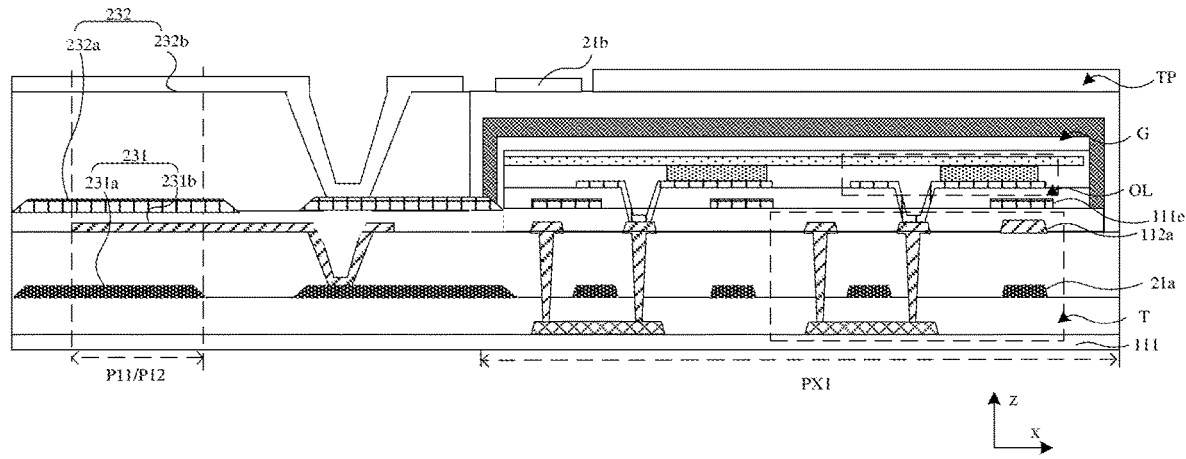
FIG. 24 illustrates a cross-sectional schematic diagram taken along a dotted line jj' in FIG. 22.
Figure 25:
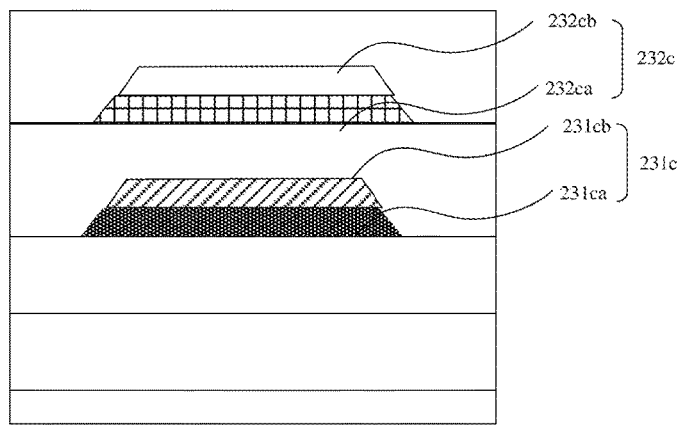
FIG. 25 illustrates a cross-sectional schematic diagram taken along a dotted line kk' in FIG. 22.

As shown in FIG. 19, in adjacent two first display sub-regions 11, the electrical connection of the second constant potential signal wire 111c is achieved through the metal connecting structure 13. Taking FIG. 19 as an example, for the first pixel unit PX1 and the second pixel unit PX2 in adjacent two first display sub-regions 11, the second constant potential signal wire 111e includes a first constant potential signal sub-wire 1113 located in the first pixel unit PX1 and a second constant potential signal sub-wire 1114 located in the second pixel unit PX2, and these two are electrically connected by the metal connecting structure 13. As shown in FIGS. 19-20, the second constant potential signal sub-wire 1114 is electrically connected to the first connecting trace 131 through a fifth via hole K5; the end 131c of the first connecting trace and the end 132c of the second connecting trace are stacked and in direct contact with each other at the connecting end 133; and the first constant potential signal sub-wire 1113 is directly connected to the second connecting trace 132.

In the present embodiment, the data signal wire 112a, the second constant potential signal wire 111c and the metal connecting structure 13 are formed by multiplexing the first metal layer and the second metal layer, so that the number of the metal film layers in the display panel can be reduced, and thus the process design difficulty of the display panel is reduced and the process yield thereof is increased.

Based on the embodiments disclosed above, the present disclosure further discloses another embodiment. As shown in FIG. 1 and FIGS. 22 to 25, the display panel is further provided with a touch unit on a light exiting side of the display region, i.e., on the flexible encapsulation layer G. The touch unit includes a touch electrode TP and a touch lead 21b. The touch lead 21b is used to provide a touch driving signal to the touch electrode TP.

Further, in the present embodiment, the metal connecting structure 13 in the stretching region 12 includes at least two metal sub-structures nested within each other in the thickness direction of the display panel. It can be interpreted that geometric centers of the two metal sub-structures substantially coincide with each other in the thickness direction of the display panel.

In an embodiment, the second metal connecting structure 23 includes at least a first metal connecting sub-structure 231 and a second metal connecting sub-structure 232.

The first metal connecting sub-structure 231 includes a first connecting sub-trace 231a, a second connecting sub-trace 231b, and a first connecting end 231c. The first connecting end 231c includes an end 231ca of the first connecting sub-trace and an end 231cb of the second connecting sub-trace, and the two are stacked and in direct contact with each other. In the thickness direction Z of the display panel, the first connecting sub-trace 231a and the second connecting sub-trace 231b intersect with each other at a first sub-region P11, and the first connecting end 231c is provided in a region other than the first sub-region P11.

The second metal connecting sub-structure 232 includes a third connecting sub-trace 232a, a fourth connecting sub-trace 232b, and a second connecting end 232c. The second connecting end 232c includes an end 232ca of the third connecting sub-trace and an end 231cb of the fourth connecting sub-trace, and the two are stacked and in direct contact with each other. In the thickness direction Z of the display panel, the third connecting sub-trace 232a and the fourth connecting sub-trace 232b intersect with each other at the second sub-region P12, and the second connecting end 232c is provided in a region other than the second sub-region P12.

In addition, for the first metal connecting sub-structure 231, the first connecting sub-trace 231a has a first curved sub-structure; the second connecting sub-trace 231b has a second curved sub-structure, and the two form a ring-shaped structure in the thickness direction Z of the display panel. For the second metal connecting sub-structure 232, the third connecting sub-trace 232a has a third curved sub-structure; the fourth connecting sub-trace 232b has a fourth curved sub-structure, and the two form a ring-shaped structure in the thickness direction Z of the display panel.

With continued reference to FIGS. 22 to 25, the signal transmission wire 21a in the display region may include a scanning signal wire and a data signal wire 112a or a constant potential signal wire 111e. A gate driving signal SCAN is provided to the plurality of pixel units PX through the scanning signal wire 111a; a data driving signal DATA is provided to the plurality of pixel units PX through the data signal wire 112a; and a constant potential is provided to the display panel through the constant potential signal wire 111e, e.g., a reference signal wire that provides a constant low potential or a PVDD signal wire that provides a constant high potential.

In this embodiment, the first metal layer is patterned to form the first connecting sub-trace 21a (i.e., the signal transmission wire) and the scanning signal wire 21a; the second metal layer is patterned to form the second connecting sub-trace 231b and the data signal wire 112a; the third metal layer is patterned to form the third connecting sub-trace 232a and the constant potential signal wire 111e; a fourth metal layer is patterned to form the fourth connecting sub-trace 232b and the touch lead 21b. In another feasible embodiment, the touch lead 21b may also be formed by patterning of the third metal layer.

With continued reference to FIGS. 22-25, in an embodiment of the present disclosure, the signal transmission wires in two adjacent first display sub-regions 11 are electrically connected to the first metal connecting sub-structure 231 to achieve that the driving signals are transmitted to the plurality of first display sub-regions 11; the touch leads in the two adjacent display sub-regions 11 are electrically connected to the second metal connecting sub-structure 232 to achieve that the touch driving signal is transmitted to the plurality of touch electrodes TP.

In the present embodiment, by multiplexing the first metal layer, the second metal layer, the third metal layer, and the fourth metal layer to form the metal connecting structure 13 having a double ring-shaped structure or a double spiral structure, the number of the metal film layers in the display panel can be reduced, and thus the process design difficulty of the display panel is reduced and the process yield thereof is increased. Moreover, the mechanical strength of the metal connecting structure 13 can be further enhanced, so that the anti-stretching ability of the stretching region 12 can be further improved.

Figure 26:
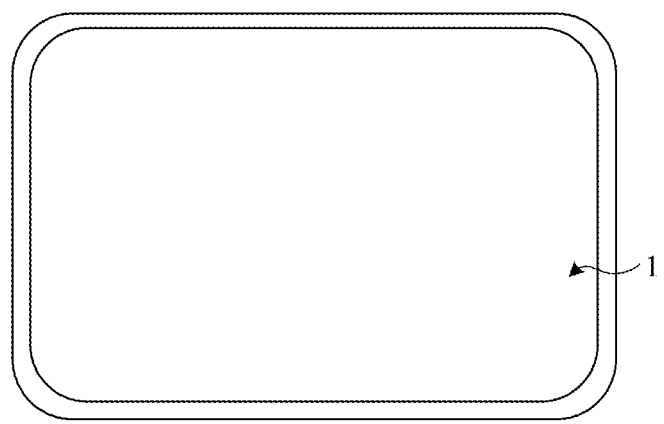
FIG. 26 illustrates a structural schematic diagram of a display device provided by an embodiment of the present disclosure.

An embodiment of the present disclosure further provides a display device as shown in FIG. 26. FIG. 26 illustrates a structural schematic diagram of the display device. The display device includes the display panel 1 as described above. The specific structure of the display panel 1 has been described in details in the above embodiments, and are not described herein again. The display device shown in FIG. 26 is representative, and the display device may be any electronic device having a display function such as a mobile phone, a tablet computer, a notebook computer, an e-book, or a television.

Since the display device provided by the embodiment of the present disclosure includes the above display panel, which provides a metal connecting structure having a buffering effect in a stretching region on the flexible display panel. The metal connecting structure is segmented and dispersed in different metal layers, and the first connecting trace and the second connecting trace provided in the different metal layers are connected through the connecting end and intersect with each other or crisscross in different layers in regions other than the connecting end. It is possible to improve bending and stretching resistance of the stretching region when an external force stretches the display panel. Further, in the case of a single-layered linear or broken-lined connecting structure, when the display panel is stretched by an external force, it is likely to damage the connection structure.

The above are representative embodiments of the present disclosure and are not intended to limit the present disclosure. Any modifications, equivalents, improvements, etc., which are made within the principles of the present disclosure, should be included in the scope of the present disclosure.

What is claimed is:

1. A stretchable flexible display panel, comprising a display region, wherein the display region comprises:
   a plurality of first display sub-regions located on a flexible substrate;
   a plurality of stretching regions located on the flexible substrate, any one of the plurality of stretching regions being located between two of the plurality of first display sub-regions; and
   a metal connecting structure provided in the plurality of stretching regions and configured to electrically connect any two adjacent ones of the plurality of first display sub-regions;
   wherein the metal connecting structure comprises a first connecting trace, a second connecting trace, and a connecting end, and the connecting end comprises an end of the first connecting trace and an end of the second connecting trace that are stacked and in direct contact with each other;
   wherein the first connecting trace is located in a first metal layer and has a first curved structure;
   wherein the second connecting trace is located in a second metal layer and has a second curved structure;
   wherein in a thickness direction of the stretchable flexible display panel, the first connecting trace and the second connecting trace intersect with each other at a first region, and the connecting end is provided in a region other than the first region; and
   wherein each of the plurality of first display sub-regions is provided with a flexible encapsulation layer; and flexible encapsulation layers of the plurality of first display sub-regions are of mutually independent structures.

2. The stretchable flexible display panel according to claim 1, wherein, in the thickness direction of the stretchable flexible display panel, orthographic projections of the first curved structure and the second curved structure form a ring-shaped structure;
   starting from the first region, the first connecting trace is arranged to extend in a first direction;

starting from the first region, the second connecting trace is arranged to extend in a second direction;

wherein an angle between the first direction and the second direction is greater than or equal to 90°.

3. The stretchable flexible display panel according to claim 2, wherein the connecting end, the first connecting trace and the second connecting trace form a spiral structure.

4. The stretchable flexible display panel according to claim 1, wherein, when the stretchable flexible display panel is stretched, either one or both of a curvature radius R1 of the first curved structure and a curvature radius R2 of the second curved structure are changed.

5. The stretchable flexible display panel according to claim 1, further comprising a signal transmission wire, through which a driving signal is provided to the plurality of first display sub-regions;

wherein the signal transmission wire is electrically connected to the metal connecting structure so as to achieve that the driving signal is transmitted to the plurality of first display sub-regions.

6. A stretchable flexible display panel, comprising a display region, wherein the display region comprises:

a plurality of first display sub-regions located on a flexible substrate;

a plurality of stretching regions located on the flexible substrate, any one of the plurality of stretching regions being located between two of the plurality of first display sub-regions;

a metal connecting structure provided in the plurality of stretching regions and configured to electrically connect any two adjacent ones of the plurality of first display sub-regions; and a signal transmission wire, through which a driving signal is provided to the plurality of first display sub-regions, wherein the metal connecting structure comprises a first connecting trace, a second connecting trace, and a connecting end, and the connecting end comprises an end of the first connecting trace and an end of the second connecting trace that are stacked and in direct contact with each other;

wherein the first connecting trace is located in a first metal layer and has a first curved structure;

wherein the second connecting trace is located in a second metal layer and has a second curved structure;

wherein in a thickness direction of the stretchable flexible display panel, the first connecting trace and the second connecting trace intersect with each other at a first region, and the connecting end is provided in a region other than the first region;

wherein the signal transmission wire is electrically connected to the metal connecting structure so as to achieve that the driving signal is transmitted to the plurality of first display sub-regions; and wherein the signal transmission wire is provided in the plurality of first display sub-regions, and the signal transmission wire has a first wire width W1; the metal connecting structure has a second wire width W2, and the second wire width W2 is greater than the first wire width W1.

7. The stretchable flexible display panel according to claim 5, wherein the signal transmission wire is provided in the plurality of first display sub-regions, and the signal transmission wire has a first thickness D1; the metal connecting structure has a second thickness D2, and the second thickness D2 is greater than the first thickness D1.

8. The stretchable flexible display panel according to claim 1, wherein the first connecting trace, the second connecting trace, and the connecting end are arranged in layers different from one another; and in the thickness direction of the stretchable flexible display panel, the connecting end is provided between the first connecting trace and the second connecting trace.

9. The stretchable flexible display panel according to claim 8, wherein a first organic buffer layer is provided between the first connecting trace and the second connecting trace, and the first organic buffer layer covers the first connecting trace;

a second organic buffer layer is provided between the first connecting trace and the connecting end; and in the thickness direction of the stretchable flexible display panel, a maximum thickness of the first organic buffer layer is greater than a maximum thickness of the second organic buffer layer.

10. The stretchable flexible display panel according to claim 9, wherein the first organic buffer layer has a first Young's modulus E1, and the second organic buffer layer has a second Young's modulus E2;

wherein the first Young's modulus E1 is smaller than 10 GPa, and the second Young's modulus E2 is smaller than 10 GPa.

11. The stretchable flexible display panel according to claim 9, wherein the plurality of stretching regions is further provided with a first organic planarization layer, and the first organic planarization layer covers the second connecting trace and the connecting end;

wherein the first organic planarization layer has a fifth Young's modulus E5, and the fifth Young's modulus E5 is smaller than 10 GPa.

12. The stretchable flexible display panel according to claim 11, wherein the first organic buffer layer, the second organic buffer layer and the first organic planarization layer comprise a same polymer resin material.

13. The stretchable flexible display panel according to claim 1, wherein the second connecting trace and the connecting end are provided in a same layer; and the first connecting trace and the second connecting trace are provided in different layers.

14. The stretchable flexible display panel according to claim 13, wherein a third organic buffer layer is provided between the first connecting trace and the second connecting trace, and the third organic buffer layer covers the first connecting trace; and a fourth organic buffer layer is provided between the first connecting trace and the connecting end;

wherein, in the thickness direction of the stretchable flexible display panel, a maximum thickness of the third organic buffer layer is substantially equal to a maximum thickness of the fourth organic buffer layer.

15. The stretchable flexible display panel according to claim 14, wherein the third organic buffer layer has a third Young's modulus E3, and the fourth organic buffer layer has a fourth Young's modulus E4;

wherein the third Young's modulus E3 is smaller than 10 GPa; and the fourth Young's modulus E4 is smaller than 10 GPa.

16. The stretchable flexible display panel according to claim 5, wherein the signal transmission wire comprises a scanning signal wire and a data signal wire;

the scanning signal wire is located in the first metal layer, and the first connecting trace is provided in a same layer as the scanning signal wire;

the data signal wire is located in the second metal layer, and the second connecting trace is provided in a same layer as the data signal wire; and scanning signal wires in adjacent two of the plurality of first display sub-regions are electrically connected through the metal connecting structure.

17. The stretchable flexible display panel according to claim 5, wherein the signal transmission wire comprises a data signal wire and a constant potential signal wire, and a constant potential is provided to the stretchable flexible display panel through the constant potential signal wire;
the data signal wire is located in the first metal layer, and the first connecting trace is provided in a same layer as the data signal wire;
the constant potential signal wire is located in the second metal layer, and the second connecting trace is provided in a same layer as the constant potential signal wire; and
data signal wires in two adjacent ones of the plurality of first display sub-regions are electrically connected through the metal connecting structure.

18. The stretchable flexible display panel according to claim 5, wherein the signal transmission wire comprises a scanning signal wire and a second constant potential signal wire, and a constant potential is provided to the stretchable flexible display panel through the second constant potential signal wire;
the scanning signal wire is located in the first metal layer, and the first connecting trace is provided in a same layer as the scanning signal wire;
the second constant potential signal wire is located in the second metal layer, and the second connecting trace is provided in a same layer as the second constant potential signal wire; and
second constant potential signal wires in two adjacent ones of the plurality of first display sub-regions are electrically connected through the metal connecting structure.

19. The stretchable flexible display panel according to claim 1, wherein the metal connecting structure at least comprises a first metal connecting sub-structure and a second metal connecting sub-structure;
wherein in the thickness direction of the stretchable flexible display panel, the first metal connecting sub-structure and the second metal connecting sub-structure are nested within each other.

20. The stretchable flexible display panel according to claim 19, wherein the first metal connecting sub-structure comprises a first connecting sub-trace, a second connecting sub-trace, and a first connecting end, and the first connecting end comprises an end of the first connecting sub-trace and an end of the second connecting sub-trace that are stacked and in direct contact with each other;
the first connecting sub-trace is located in the first metal layer and has a first curved sub-structure;
the second connecting sub-trace is located in the second metal layer and has a second curved sub-structure;
in the thickness direction of the stretchable flexible display panel, the first connecting sub-trace and the second connecting sub-trace intersect with each other at a first sub-region, and the first connecting end is provided in a region other than the first sub-region;
the second metal connecting sub-structure comprises a third connecting sub-trace, a fourth connecting sub-trace, and a second connecting end, and the second connecting end comprises an end of the third connecting sub-trace and an end of the fourth connecting sub-trace that are stacked and in direct contact with each other;
the third connecting sub-trace is located in a third metal layer and has a third curved sub-structure;
the fourth connecting sub-trace is located in a fourth metal layer and has a fourth curved sub-structure; and
in the thickness direction of the stretchable flexible display panel, the third connecting sub-trace and the fourth connecting sub-trace intersect with each other in a second sub-region, and the second connecting end is provided in a region other than the second sub-region.

21. The stretchable flexible display panel according to claim 20, further comprising:
a signal transmission wire, through which a driving signal is provided to the plurality of first display sub-regions; and
a touch unit, comprising a touch electrode and a touch lead, a touch driving signal being provided to the touch electrode through the touch lead;
wherein the signal transmission wire is electrically connected to the first metal connecting sub-structure so as to achieve that the touch driving signal is transmitted to the plurality of first display sub-regions;
the touch lead is electrically connected to the second metal connecting sub-structure, to achieve that the touch driving signal is transmitted to a plurality of said touch electrodes.

22. The stretchable flexible display panel according to claim 21, wherein the touch lead is formed by patterning of the third metal layer or patterning of the fourth metal layer.

23. The stretchable flexible display panel according to claim 1, wherein the plurality of first display sub-regions comprises a plurality of pixel units; no such pixel unit is provided in the plurality of stretching regions.

24. The stretchable flexible display panel according to claim 1, wherein
in the plurality of stretching regions is provided with no said flexible encapsulation layer.

25. A stretchable display device, comprising a stretchable flexible display panel comprising a display region, wherein the display region comprises:
a plurality of first display sub-regions located on a flexible substrate;
a plurality of stretching regions located on the flexible substrate, any one of the plurality of stretching regions being located between two of the plurality of first display sub-regions; and
a metal connecting structure provided in the plurality of stretching regions and configured to electrically connect any two adjacent ones of the plurality of first display sub-regions;
wherein the metal connecting structure comprises a first connecting trace, a second connecting trace, and a connecting end, and the connecting end comprises an end of the first connecting trace and an end of the second connecting trace that are stacked and in direct contact with each other;
the first connecting trace is located in a first metal layer and has a first curved structure;
the second connecting trace is located in a second metal layer and has a second curved structure;
in a thickness direction of the stretchable flexible display panel, the first connecting trace and the second connecting trace intersect with each other at a first region, and the connecting end is provided in a region other than the first region; and
each of the plurality of first display sub-regions is provided with a flexible encapsulation layer; and flexible encapsulation layers of the plurality of first display sub-regions are of mutually independent structures.

* * * * *